United States Patent [19]

Fukunaga et al.

[11] Patent Number: 4,691,975

[45] Date of Patent: Sep. 8, 1987

[54] INTEGRATED CIRCUIT TESTER SOCKET

[75] Inventors: Masami Fukunaga; Tomoyoshi Yamaguchi, both of Kawaguchi, Japan

[73] Assignee: Dai-Ichi Seiko Kabushiki Kaisha, Kawaguchi, Japan

[21] Appl. No.: 921,255

[22] Filed: Oct. 21, 1986

[30] Foreign Application Priority Data

Oct. 21, 1985 [JP] Japan .................. 60-235054

[51] Int. Cl.⁴ ......................... H01R 13/635
[52] U.S. Cl. ...................... 439/266; 439/68
[58] Field of Search ........... 339/17 LF, 74 R, 75 M, 339/75 MP

[56] References Cited

U.S. PATENT DOCUMENTS

| | | | |
|---|---|---|---|
| 3,805,212 | 4/1974 | Landman et al. | 339/17 CF |
| 4,491,377 | 1/1985 | Pfaff | 339/17 CF |
| 4,533,192 | 8/1985 | Kelley | 339/17 CF |
| 4,623,208 | 11/1986 | Kerul et al. | 339/17 CF |

FOREIGN PATENT DOCUMENTS 2431816  1/1975  Fed. Rep. of Germany ... 339/17 CF
60-81654  6/1985  Japan .

Primary Examiner—John McQuade
Attorney, Agent, or Firm—Cushman, Darby & Cushman

[57] ABSTRACT

In order to construct an IC-tester socket as a whole into a compact size and to make the mounting and removal of an IC package easy and further to enable stable and positive contact between the lead terminals of the IC package and contact pins, the IC-tester socket is comprised of a socket body capable of accomodating an IC package; a plurality of contact pins provided within the socket body and each having resilient first and second arms capable, in their normal state, of nipping each said lead terminal; and releasers mounted vertically movably on the socket body for being able to release the nipping of the lead terminals done by these first and second arms.

4 Claims, 5 Drawing Figures

INTEGRATED CIRCUIT TESTER SOCKET

BACKGROUND OF THE INVENTION (a) Field of the invention:

The present invention relates to a socket used for the testing of integrated circuits (hereinafter to be referred to as IC) with respect to their electric testing or functional measurement.

(b) Description of the prior art:

Production of ICs has been on a substantial increase of late, and accordingly it has become a critcal problem how quickly ICs can be tested.

As the prior art apparatus for testing and measuring ICs, there has been utilized an IC-tester socket.

Among those prior art IC-tester sockets, an IC-tester socket of the type which is used for the testing of, for example, a flat type IC having IC package terminals designed so as to be connected to external circuits at lateral sides of the IC package is constructed with a socket body housing therein contact pins which are to be connected to said lead terminals, and with a cover member for maintaining the connection between said lead terminals and contact pins by being depressed by the IC package mounted onto the socket body from thereabove.

However, the IC-tester socket of the prior art having the above-mentioned construction requires the cover member and also a mechanism for locking this cover member (see Japanese Utility Model Preliminary Publication No. Sho 60-81654).

For this reason, the prior art socket as a whole has tended to be large in size relative to the size of the IC package which is to be tested. In case, for example, an IC-tester socket is placed in a constant temperature vessel for the purpose of performing a test, it has been unable to place a number of IC-tester sockets into the vessel, so that there has been the drawback that a number of ICs can not be tested at a time.

Also, in case an IC package is to be attached to and removed from a socket body according to the prior art, the operator is required to make opening and closing operations of the cover member as well as the locking and unlocking operations of the locking mechanism for each mounting and removing of the IC package onto and from the socket. Furthermore, in the manufacture of the socket per se also, the operations such as the attachment of the cover-member locking mechanism onto the socket body are complicated. In addition, the prior art arrangement is such that contact pins are designed to be brought into contact with the lower end face of the lead terminals at a single site thereof, and thus there has been an additional drawback that there could occur instances wherein electric connection is not realized in a stable fashion.

SUMMARY OF THE INVENTION

It is therefore, an object of the present invention to provide an IC-tester socket whose body as a whole is compact in size as compared to the conventional such sockets.

Another object of the present invention is to provide an IC-tester socket which allows an easy attachment and removal of an IC package.

Still another object of the present invention is to provide an IC-tester socket which assures stable electric connection by performing the contact between the lead terminals of the attached IC-package and the contact pins at two sites.

Yet another object of the present invention is to provide an IC-tester socket which can be used also in the testing of such ICs as having leads of narrow pitches.

A further object of the present invention is to provide an IC-tester socket which allows an easy formation or molding as well as assembling of the socket body.

The IC-tester socket of the present invention has the construction comprising contact pins each being formed with a pair of nipping pins designed to positively nip the bent portion of a lead terminal to stably ensure their contact, and to securely anchoring an IC package to the socket body. Whereby, the contact between the contact pins and the lead terminals of the IC package is ensured since such contact is performed at two sites respectively, and along therewith the cover member for depressing the IC package as well as the mechanism for locking this cover member become unnecessary. Accordingly, it becomes possible to make easy the opening and closing operations of the cover member and of the locking mechanism of this cover member, as well as the attachment of the locking mechanism or other operations during the manufacturing process, whereby a large number of ICs can be tested simultaneously and quickly.

These and other objects, features and advantages of the present invention will become more apparent during the course of the following detailed description and appended claims.

DETAILED DESCRIPTION OF THE PREFERRED EMBODIMENT

Figure 1:
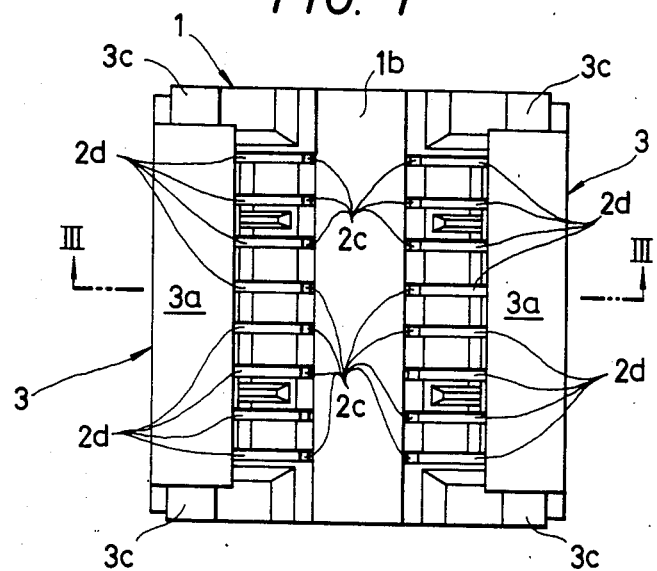
FIG. 1 is a plan view of the IC-tester socket according to the present invention, in which an IC package is in the state of being mounted thereon.
Figure 2:
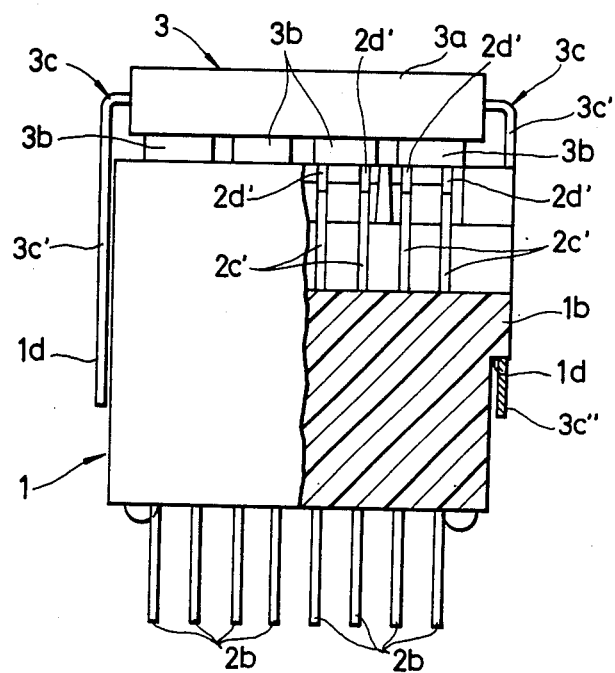
FIG. 2 is a right side elevation of FIG. 1, partly broken away.
Figure 3:
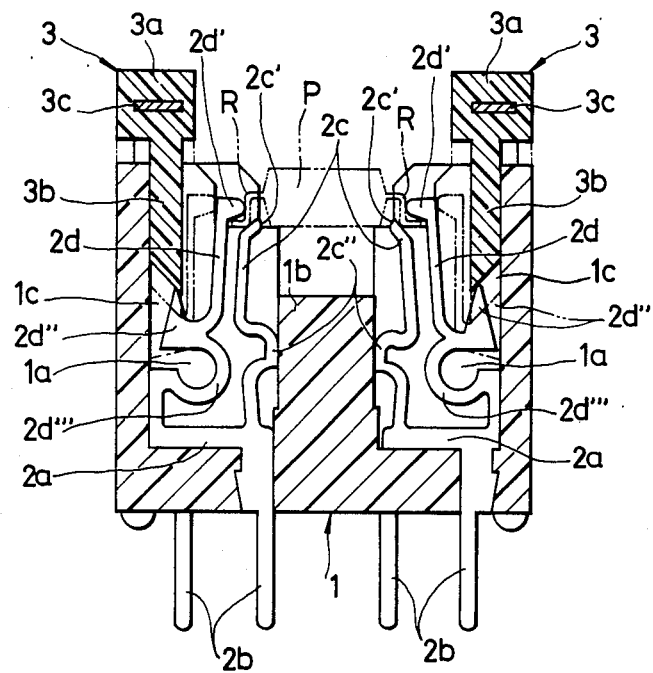
FIG. 3 is a vertical sectional view taken along the line III—III in FIG. 1.
Figure 4:
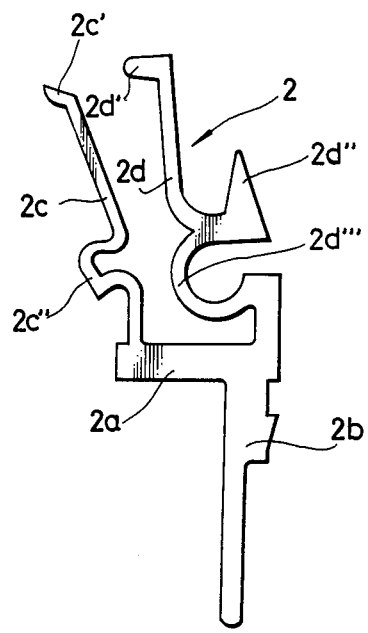
FIG. 4 is a front view of a contact pin which is in its relaxed stated.
Figure 5:
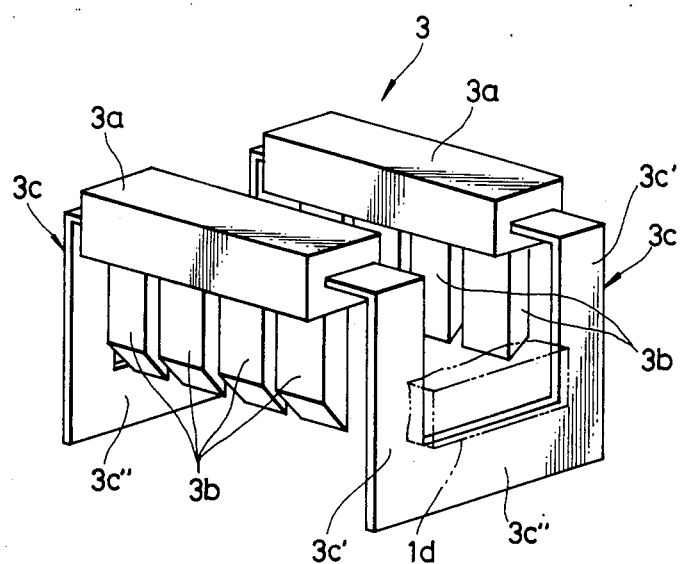
FIG. 5 is a perspective of a releaser.

An embodiment of the IC-tester socket according to the present invention will hereunder be described by referring to FIGS. 1 to 5.

In the drawings, reference numeral 1 denotes a socket body which is comprised of an electricity-insulating material and formed in a substantially box-like shape by relying on, for example, the extrusion-molding technique. Inside the socket body 1, there are provided channels 1a which are arranged in mutually facing rows, each channel containing a contact pin inserted therein which will be described later, a central wall 1b, and vertical guide holes 1c for guiding the vertical movements of releasers which will be described later also. On the opposite external side faces of the socket body 1, there are formed stepped portions 1d (FIG. 2) for restricting the upward movements of the releasers.

Numeral 2 represents a resilient, electrically-conductive contact pin which is formed by punching through a plate, and it has a horizontal base portion 2a which is stopped of its further movement by the bottom face of the channel 1a formed in the socket body 1, a terminal portion 2b which extends downwardly from the base portion 2a and passes through the bottom wall of the socket body 1 to project downwardly therefrom, first arm 2c which, in its state of just having been punched through from a plate, i.e. in its relaxed state, extends substantially obliquely upwardly from the base portion 2a, but is urged against a lateral face of the central wall 1b of the socket body 1 in its assembled state to be forced to extend vertically upwardly through the channel 1a from the base portion 2a, and a second arm 2d extending substantially vertically upwardly within the channel 1a from the base portion 2a. As shown clearly in FIG. 3, the first and second arms 2c and 2d are formed in such a manner that, when they are assembled within the channel 1a, they are capable of nipping, by their forward end portions, the lead terminal R of the IC package P which has been mounted in the socket body 1. That is, the forward end portion 2c' of the first arm 2c which constitutes a first contact portion is formed to be inclined obliquely so as to match the configuration of the lead terminal R. The forward end portion 2d' of the second arm 2d which constitutes a second contact portion is also formed so as to match the configuration of the lead terminal R. Also, the first arm 2c has the formation of a bent portion 2c" which is brought into contact with the lateral side face of the central wall 1b and which is useful in imparting a proper resiliency to the first arm as a whole. Furthermore, the second arm 2d has the formation of a triangular-shaped engaging portion 2d" which engages the releaser which will be described later and also an arcuate curved portion 2d'" which is useful to cause a proper restoring power in the second arm when the latter is displaced to the external direction. When the contact pin 2 is inserted in the channel 1a and assembled in its predetermined position, the first arm 2c is forcibly deformed from the state shown in FIG. 4 to the state of FIG. 3, whereby the contact pin 2 is rendered to the state in which the pin is urged against toward one side within the channel 1a, and thus it is fixed within this channel.

Numeral 3 represents a releaser which is constructed with a heat-resisting synthetic resin intended to release the lead terminal R of the IC package, which terminal having been nipped by the first and second arms 2c and 2d. This releaser 3 is comprised of urging or depressing portions 3a which are disposed so as to be superposed onto the top faces of the mutually facing lateral sides, respectively, of the socket body 1, a plurality of projections 3b extending downwardly from the respective urging portions 3a and slidably inserted within the guide channel 1c of the socket body 1, and a coupling portion 3c for integrally coupling the paired urging portions 3a together. The bottom end of the projection 3b is made to incline downwardly inwardly so that it engages the forward end of the engaging portion 2d" formed on the second arm 2b of the contact pin 2 so as to be able to displace the second arm 2b in the external direction up to the position shown by the chain line in FIG. 3 when the projection 3b is caused to descend. In the case of this instant embodiment, one downwardly extending projection 3b is disposed so as to engage in common a pair of contact pins which are arranged side-by-side relationship. Accordingly, each urging portion 3a has the formation of four projections 3b. The coupling portion 3c is formed by a resilient plate member such as a stainless steel plate. As shown clearly in FIG. 5, it is comprised of a vertical side 3c' which is bent at right angles, and a lateral side 3c" intended to prevent the releaser 3 from coming off the socket body 1 by engaging the stepped portion 1d which is formed on the outer side face of the socket body 1. This releaser may be made by relying on an integral molding technique by using such a material as a copolymer, PES or the like having a heat-resistivity, an appropriate resiliency and a superior creep property.

Next, description will be made of the function of the above-described IC-tester socket.

To begin with, description will be made of the instance wherein an IC package P is mounted into the socket body 1. The urging portion 3a of the releaser 3 is pressed downwardly. Whereupon, the downward-directed projection 3b descends through the guide hole 1c, and its inclined forward end face descends while it is in contact with the forward end of the engaging portion 2d". Accordingly, the second arm 2d of the contact pin 2 is warped in the external direction, against its habitude, up to the position shown by the chain line in FIG. 3. As a result, a forward end portion 2d' of the second arm 2d is caused to depart away from the forward end portion 2c' of the first arm 2c. In this state, the IC package P is caused to descend into the socket body 1 from thereabove, to insert its lead terminal R into the space between the forward end portion 2c' of the first arm 2c and the forward end portion 2d' of the second arm 2d. In succession thereto, the urging force applied to the releaser 3 is removed. Whenupon, the second arm 2d would tend to return to its initial position while pushing up the releaser 3 by the restoring force of the second arm 2d. As a result, the lead terminal R of the IC package P is nipped between the forward end portion 2c' of the first arm 2c and the forward end portion 2d' of the second arm 2d, so that the lead terminal R is rendered to the state of being contacted by the contact pin 2 at two sites, and also the forward end portion 2d' of the second arm 2d will down-press the lead terminal R from thereabove, to thereby anchor the IC package P.

Next, in case it is intended to take out the mounted IC package P from within the socket body 1, it is only necessary to depress the depressing portion 3a of the releaser 3 in a manner similar to that stated above to thereby open apart the forward end portions 2c' and 2d' of the contact pin 2 relative to each other, and to draw the IC package P out upwardly. By removing the depression which has been applied till then to the releaser 3, the depressing portion 3a and the second arm 2d of the contact pin 2 will be restored back to their initial positions, respectively.

As will be clear from the foregoing description, in the IC-tester socket according to the present invention, the contact pin 2 per se has the function and ability to anchor the IC package within the socket body. Therefore, the cover member for urging the lead terminal of the IC package against the contact pin and the mechanism of locking the cover member which both have been required by the conventional IC-tester socket become unnecessary. As a result, the volume of the socket as a whole can be made compact, which in turn makes it possible to realize a simultaneous testing of a number of IC packages P in a limited space of, for example, a constant temperature vessel. Also, the attachment and removal of IC packages can be performed only by the depression and removal of this depression of the releaser 3, so that the attachment and removal operation become extremely easy.

Also, the second arm 2d of the contact pin 2 not only serves to nip the lead terminal R of the IC package P, but also it displays the locking function, so that the mounting of the IC package P can be performed without fail. Also, the contact between the lead terminal R of the IC pakcage P and the contact pin 2 will provide a dual face contact in the form that the lead terminal R is nipped by a pair of forward end portions 2c' and 2d', so that there is the advantage represented by an improved stability of contaction. Furthermore, the pair of arms 2c and 2d of the contact pin 2 invariably possess curved portions 2c'' and 2d''' near their base portions, and also the arm 2c is assembled to the socket body in its state of being warped by the central projection 1b of the socket body 1 toward its plate face. Thus, the contact pin can be positively fixed to the socket body, and the forward end portion of the arm can have an extremely appropriate spring property. As a result, it is possible to make the thickness of the contact pin very thin such as 0.2~0.3 mm. As a result, there can be provided a socket which can be used also in the testing of an IC having leads of very narrow pitches.

What is claimed is:

1. An IC-tester socket, comprising:
   a socket body capable of accomodating therein an IC package having a plurality of outwardly projecting lead terminals;
   a plurality of contact pins provided within said socket body, each having a first and a second resilient arm capable of anchoring, at predetermined positions within said socket body, said IC package as said arms in their normal state nip each of said lead terminals; and
   a releaser vertically movably mounted within said socket body and having a plurality of downwardly extending projections each engaging said second arm,
   whereby when said releaser is depressed downwardly, said second arm is warped by said downwardly extending projections, thereby the nipping of said lead terminals by said first and second arms is released.

2. An IC-tester socket according to claim 1, in which:
   said first arm of each said contact pin is provided with a bent portion for holding said contact pin within said socket body in the state in which said first arm is displaced.

3. An IC-tester socket according to claim 1, in which:
   at least one of said first and second arms has the formation of a curved portion to bring said first and second arms of each said contact pin into resilient contact with said lead terminal.

4. An IC-tester socket according to claim 1, in which:
   said first and second arms have their forward end portions intended to nip said lead terminal and being formed to have a shape matching said lead terminal.

* * * * *

REEXAMINATION CERTIFICATE (4189th)

United States Patent [19]

Fukunaga et al.

[11] B1 4,691,975

[45] Certificate Issued Oct. 31, 2000

[54] INTEGRATED CIRCUIT TESTER SOCKET

[75] Inventors: Masami Fukunaga; Tomoyoshi Yamaguchi, both of Kawaguchi, Japan

[73] Assignee: Dai-Ichi Seiko Kabushiki Kaisha, Kawaguchi, Japan

Reexamination Request:
No. 90/005,091, Aug. 27, 1998

Reexamination Certificate for:
Patent No.: 4,691,975
Issued: Sep. 8, 1987
Appl. No.: 06/921,255
Filed: Oct. 21, 1986

[30] Foreign Application Priority Data

Oct. 21, 1985 [JP] Japan ................................. 60-235054

[51] Int. Cl.[7] ................................................ H01R 13/635
[52] U.S. Cl. ............................................ 439/266; 439/68
[58] Field of Search ....................... 439/70–73, 259–270, 439/68

[56] References Cited

U.S. PATENT DOCUMENTS

| | | | |
|---|---|---|---|
| 3,391,383 | 7/1968 | Antes ...................................... | 339/174 |
| 3,605,075 | 9/1971 | Stofkooper ............................. | 339/126 |
| 3,820,054 | 6/1974 | Clewes et al. .......................... | 339/17 |
| 4,189,199 | 2/1980 | Grau . | |
| 4,222,622 | 9/1980 | Griffin et al. . | |
| 4,252,390 | 2/1981 | Bowling .................................. | 339/17 |
| 4,266,840 | 5/1981 | Siedler .................................... | 339/75 |
| 4,349,238 | 9/1982 | Showman et al. ..................... | 339/75 |
| 4,354,718 | 10/1982 | Bright et al. ........................... | 339/17 |
| 4,527,850 | 7/1985 | Carter ..................................... | 339/75 |
| 4,583,806 | 4/1986 | Taintr, Jr. et al. ...................... | 339/75 |
| 4,679,871 | 7/1987 | Egawa .................................... | 439/70 |
| 4,713,022 | 12/1987 | Pfaff ...................................... | 439/331 |
| 4,750,890 | 6/1988 | Dube et al. ............................ | 439/152 |
| 4,758,176 | 7/1988 | Abe et al. ............................... | 439/331 |

FOREIGN PATENT DOCUMENTS

| | | |
|---|---|---|
| 50-94490 | 8/1975 | Japan . |
| 53-43876 | 4/1978 | Japan . |
| 56-45581 | 4/1981 | Japan . |
| 57-18338 | 1/1982 | Japan . |
| 60-81654 | 6/1985 | Japan . |
| 62-58879 | 4/1987 | Japan . |
| 63-129878 | 8/1988 | Japan . |
| 3-47268 | 10/1991 | Japan . |
| 2 039 160 | 7/1980 | United Kingdom . |

*Primary Examiner*—Gary F. Paumen

[57] ABSTRACT

In order to construct an IC-tester socket as a whole into a compact size and to make the mounting and removal of an IC package easy and further to enable stable and positive contact between the lead terminals of the IC package and contact pins, the IC-tester socket is comprised of a socket body capable of accomodating an IC package; a plurality of contact pins provided within the socket body and each having resilient first and second arms capable, in their normal state, of nipping each said lead terminal; and releasers mounted vertically movably on the socket body for being able to release the nipping of the lead terminals done by these first and second arms.

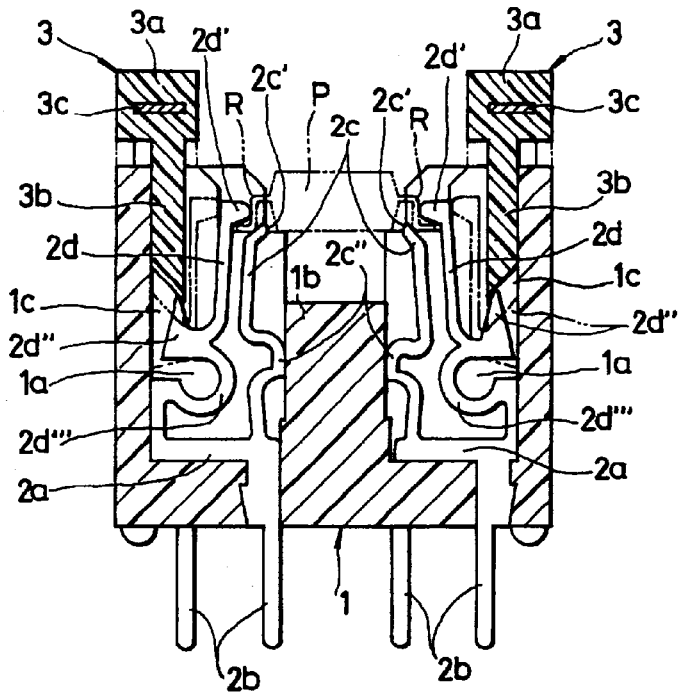

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 1 is determined to be patentable as amended.

Claims 2–4, dependent on an amended claim, are determined to be patentable.

New claims 5 and 6 are added and determined to be patentable.

1. An IC-tester socket, comprising:
    a socket body capable of [accomodating] *accommodating* therein an IC package having a plurality of outwardly projecting lead terminals;
    a plurality of contact pins provided within said socket body, each having a first and a second resilient arm capable of anchoring, at predetermined positions within said socket body, said IC package as said arms in their normal state nip each of said lead terminals; and
    a releaser vertically movably mounted within said socket body and having a plurality of downwardly extending projections each engaging said second arm *without engaging said first arm,*
    whereby when said releaser is depressed downwardly, said second arm is warped by said downwardly extending projections *without substantially warping said first arm,* thereby the nipping of said lead terminals by said first and second arms is released.

5. *An IC-tester socket, comprising:*
    *a socket body capable of acccommodating therein an IC package having a plurality of outwardly projecting lead terminals;*
    *a plurality of contact pins provided within said socket body, each having a first and a second resilient arm capable of anchoring, at predetemined positions within said socket body, said IC package as said arms in their normal state nip each of said lead terminals, and wherein each arm is formed with a forward end portion; and*
    *a releaser vertically movably mounted within said socket body and having a plurality of downwardly extending projections each engaging only said second arm,*
    *whereby when said releaser is depressed downwardly, said only second arm is warped by said downwardly extending projections causing the respective forward end portions of each arm to open apart relative to each other, thereby the nipping of said lead terminals by said first and second arms is released.*

6. *An IC-tester socket, comprising;*
    *a socket body capable of accommodating therein an IC package having a plurality of outwardly projecting lead terminals;*
    *a plurality of contact pins provided within said socket body, each having a first and a second resilient arm capable of anchoring, at predetermined positions within said socket body, said IC package as said arms in their normal state nip each of said lead terminals, and wherein each of said second resilient arms are formed with an engaging portion; and*
    *a releaser vertically movably mounted within said socket body and having a plurality of downwardly extending projections each engaging said engaging portion of said respective second arm without engaging said first arm,*
    *whereby when said releaser is depressed downwardly, said second arms are warped by said downwardly extending projections without substantially warping said first arms, thereby the nipping of said lead terminals by said first and second arms is released.*

\* \* \* \* \*